(12) United States Patent
Kobayashi et al.

(10) Patent No.: US 9,645,290 B2
(45) Date of Patent: May 9, 2017

(54) COLOR FILTER ARRAY AND SOLID-STATE IMAGE SENSOR

(71) Applicant: Kabushiki Kaisha Toshiba, Minato-ku (JP)

(72) Inventors: Mitsuyoshi Kobayashi, Ota (JP); Risako Ueno, Meguro (JP); Kazuhiro Suzuki, Minato (JP); Hiroto Honda, Yokohama (JP); Honam Kwon, Kawasaki (JP); Hideyuki Funaki, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 252 days.

(21) Appl. No.: 14/479,921

(22) Filed: Sep. 8, 2014

(65) Prior Publication Data

US 2015/0077600 A1    Mar. 19, 2015

(30) Foreign Application Priority Data

Sep. 19, 2013 (JP) ................ 2013-194545

(51) Int. Cl.
| | |
|---|---|
| *H04N 9/083* | (2006.01) |
| *G02B 5/20* | (2006.01) |
| *G02B 3/00* | (2006.01) |
| *H04N 9/04* | (2006.01) |
| *H01L 27/146* | (2006.01) |
| *H04N 5/225* | (2006.01) |
| *H04N 3/14* | (2006.01) |

(52) U.S. Cl.
CPC ........... *G02B 5/201* (2013.01); *G02B 3/0056* (2013.01); *H01L 27/14621* (2013.01); *H04N 5/225* (2013.01); *H04N 9/045* (2013.01); *H01J 2229/893* (2013.01); *H04N 2209/045* (2013.01); *H04N 2209/049* (2013.01)

(58) Field of Classification Search
CPC ............ H04N 9/045; H04N 2209/045; H04N 2209/049; H01L 27/14621; H01J 2229/893
USPC ................................................. 348/265, 271
See application file for complete search history.

(56) References Cited

U.S. PATENT DOCUMENTS

| | | | |
|---|---|---|---|
| 6,933,976 B1 | 8/2005 | Suzuki | |
| 7,476,833 B2 * | 1/2009 | Inaba | ................ H01L 27/14627 250/208.1 |
| 8,035,711 B2 * | 10/2011 | Liu | ........................ H04N 9/045 348/277 |

(Continued)

FOREIGN PATENT DOCUMENTS

| | | |
|---|---|---|
| CN | 101625458 A | 1/2010 |
| JP | 59-204804 A | 11/1984 |

(Continued)

OTHER PUBLICATIONS

Combined Chinese Office Action and Search Report issued Jun. 27, 2016 in Patent Application No. 201410461618.8 (with partial English translation and English translation of categories of cited documents).

(Continued)

*Primary Examiner* — Ngoc-Yen Vu

(74) *Attorney, Agent, or Firm* — Oblon, McClelland, Maier & Neustadt, L.L.P.

(57) ABSTRACT

According to an embodiment, a color filter array includes a plurality of color filters of multiple colors. The color filters are arranged so that each of the color filter of each color corresponds to any one of a plurality of microlenses included in a microlens array. Each microlens is configured to irradiate a plurality of pixels with light.

17 Claims, 17 Drawing Sheets

(56) References Cited

U.S. PATENT DOCUMENTS

| | | | |
|---|---|---|---|
| 9,143,760 B2* | 9/2015 | Okigawa | H04N 13/0217 |
| 9,293,491 B2* | 3/2016 | Kanamori | G02B 23/24 |
| 2004/0105021 A1* | 6/2004 | Hu | H04N 9/045 |
| | | | 348/272 |
| 2007/0030379 A1 | 2/2007 | Agranov | |
| 2010/0253820 A1 | 10/2010 | Kanamori et al. | |
| 2013/0062512 A1* | 3/2013 | Hu | H01L 27/14601 |
| | | | 250/226 |
| 2015/0070532 A1* | 3/2015 | Masuda | H01L 27/14625 |
| | | | 348/234 |
| 2015/0288935 A1* | 10/2015 | Shinozaki | H04N 5/367 |
| | | | 348/322 |

FOREIGN PATENT DOCUMENTS

| | | |
|---|---|---|
| JP | 2001-77344 | 3/2001 |
| JP | 2006-215515 A | 8/2006 |
| JP | 2010-166580 | 7/2010 |
| JP | 2012-80363 | 4/2012 |
| JP | 2013-520936 A | 6/2013 |
| TW | 200717784 A | 5/2007 |

OTHER PUBLICATIONS

Combined Taiwanese Office Action and Search Report issued Apr. 26, 2016 in Patent Application No. 103130401 (with English language translation).

T. Georgiev, et al., "Reducing Plenoptic Camera Artifacts", Computer Graphics forum, vol. 29, No. 6, 2010, 14 pages.

* cited by examiner

FIG.18
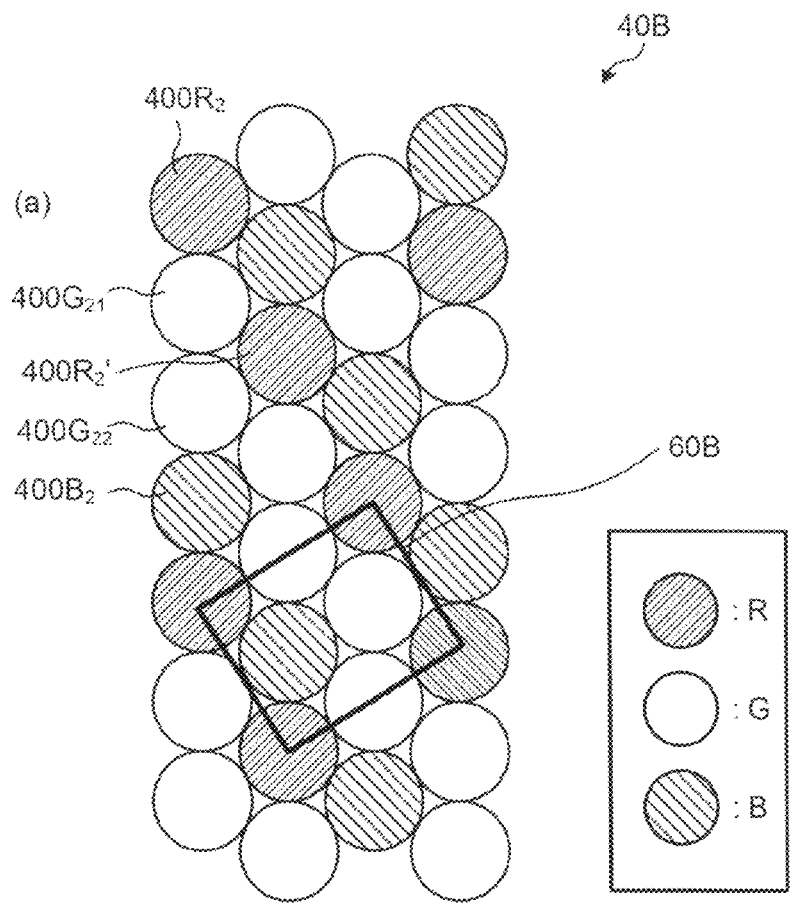
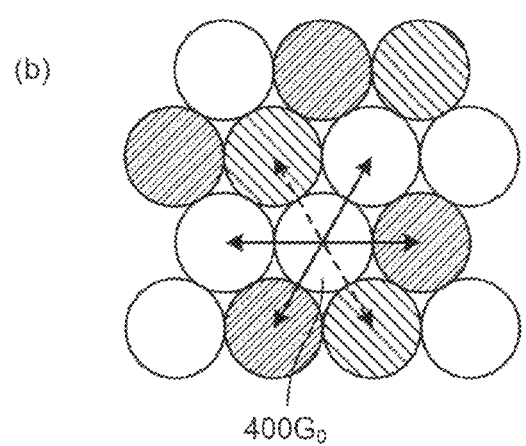

FIG.19
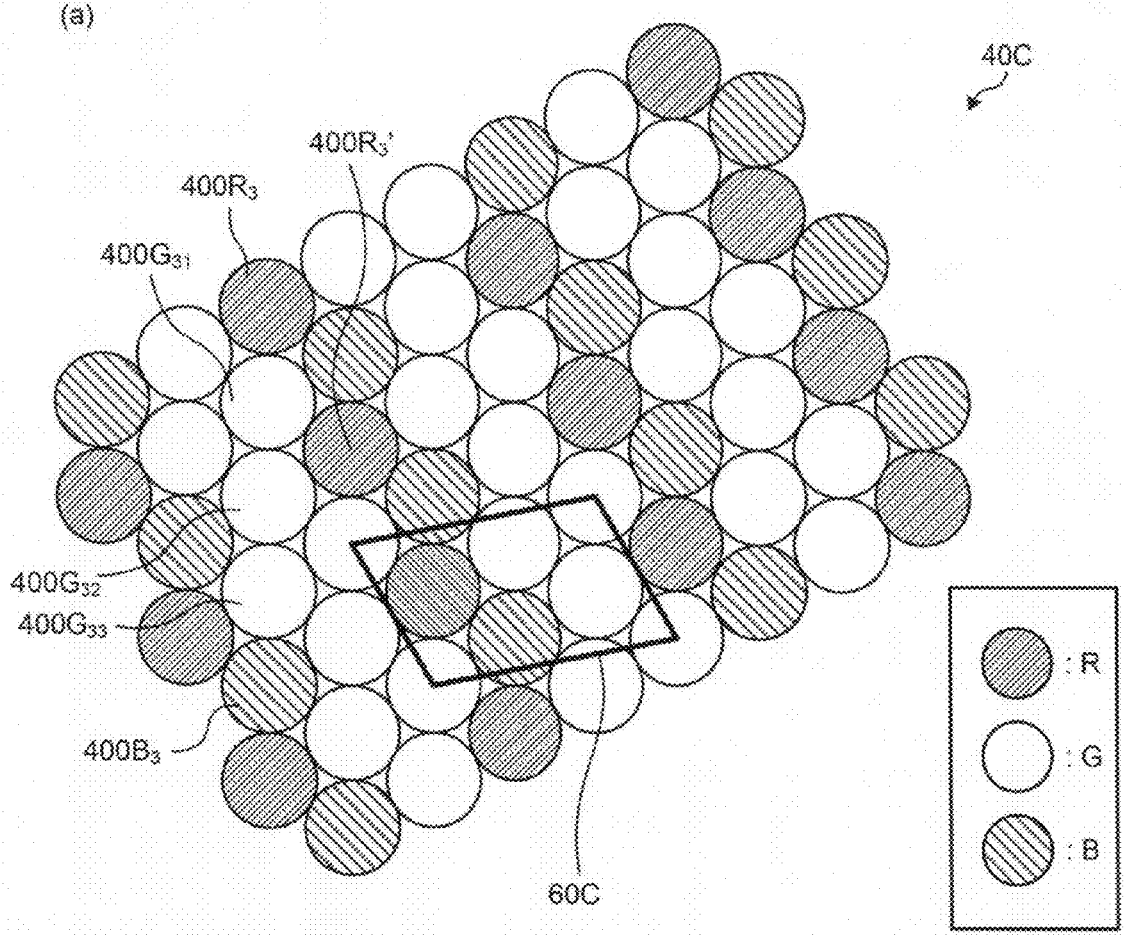
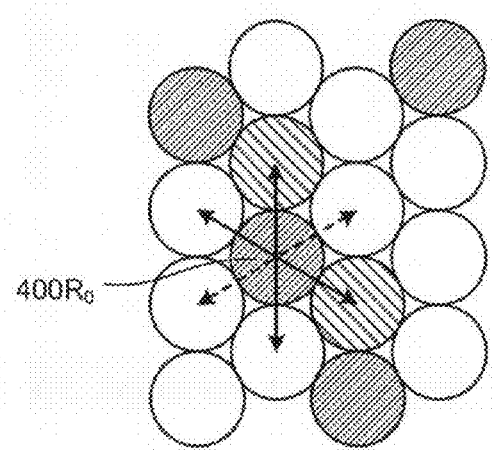

COLOR FILTER ARRAY AND SOLID-STATE IMAGE SENSOR

CROSS-REFERENCE TO RELATED APPLICATION

This application is based upon and claims the benefit of priority from Japanese Patent Application No. 2013-194545, filed on Sep. 19, 2013; the entire contents of which are incorporated herein by reference.

FIELD

Embodiments disclosed herein relate generally to a color filter array and a solid-state image sensor.

BACKGROUND

Solid-state image sensors configured to receive light from an object with an image sensor such as a charge coupled device (CCD) and a complementary metal oxide semiconductor (CMOS) imager, output a signal for each pixel resulting from photoelectric conversion to obtain an image are known. To obtain a color image by using such a solid-state image sensor, color filters of R (red), G (green) and B (blue) are commonly provided for respective pixels over a light receiving surface of an image sensor to output signals of R, G, and B.

In the meantime, a structure in which a microlens array is arranged above pixels, multiple pixels are arranged below microlenses to further focus an image from a main lens on the pixels by using the microlens array is proposed as a structure of an imaging optical system. With this structure, a group of images having disparities in units of pixel blocks can be obtained, and the disparities allow a refocusing process or the like on the basis of distance estimation or distance information of an object. The optical configuration to further focus an image from the main lens by using the microlens array is referred to as a refocusing optical system.

One example of factors that degrade the quality of images captured by an image sensor is crosstalk referring to light incident on a pixel enters an adjacent pixel. For example, consider color filters for respective pixels in the Bayer array in which a row of G, B, G, B, . . . and a row of R, G, R, G, . . . are alternately repeated that are used in a common image sensor. If crosstalk is caused in the Bayer arrangement, color mixture leading to erroneous detection of light of different color components in the pixels may be caused and the color reproducibility of a captured image is degraded.

In the refocusing optical system described above, light beams from the main lens pass through the respective microlenses and are received by the light receiving surface of the image sensor at incident angles depending on the positions of the microlenses. Thus, crosstalk between pixels as described above may also be caused in the refocusing optical system.

BRIEF DESCRIPTION OF THE DRAWINGS

FIG. 18 illustrates specific examples of the color filter array according to the embodiment; and FIG. 19 illustrates specific examples of the color filter array according to the embodiment.

DETAILED DESCRIPTION

According to an embodiment, a color filter array includes a plurality of color filters of multiple colors. The color filters are arranged so that each of the color filter of each color corresponds to any one of a plurality of microlenses included in a microlens array, each microlens being configured to irradiate a plurality of pixels with light. Each microlens is configured to irradiate a plurality of pixels with light.

Figure 1:
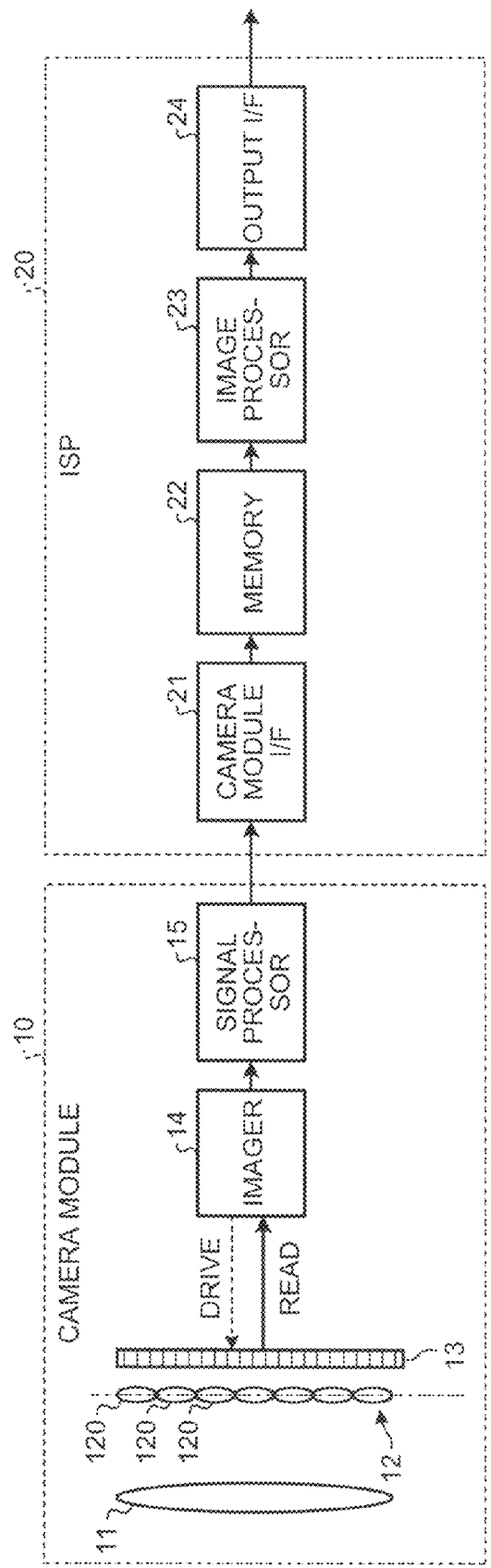
FIG. 1 is a block diagram illustrating an example configuration of an imaging device that can be applied to an embodiment.

A color filter array and a solid-state image sensor according to an embodiment will be described below. FIG. 1 illustrates an example configuration of an imaging device that can be applied to the embodiment. In FIG. 1, the imaging device 1 includes a camera module 10 that is a lens unit and an image signal processor (ISP) 20.

The camera module 10 includes imaging optics including a main lens 11, a solid-state image sensor including a microlens array 12 and an image sensor 13, an imager 14, and a signal processor 15. The imaging optics includes one or more lenses, and is configured to guide light from an object to the microlens array and the image sensor 13. The lens that is closest to the image sensor 13 of the lenses included in the imaging optics is the main lens 11.

The image sensor 13 is a charge coupled device (CCD) or a complementary metal oxide semiconductor (CMOS) imager, for example, and includes a pixel array including multiple pixels each configured to convert received light into an electric signal through photoelectric conversion.

The microlens array 12 includes multiple microlenses 120, 120, . . . arranged according to a predetermined rule.

The microlens array 12 reduces and refocuses a group of light beams focused on an image plane by the main lens 11 onto a pixel block including multiple pixels on the image sensor 13 respectively associated with the microlenses 120, 120, . . . .

Although not illustrated in FIG. 1, a color filter array according to the embodiment is provided on the side closer to the image sensor 13 or the main lens 11 of the microlens array 12. The color filter array includes multiple color filters for separation into the three primary colors of R (red), G (green), and B (blue), for example, and is arranged so that one color filter is associated with one microlens 120.

In the camera module 10, the imaging optical system including the main lens 11 and the other part are separated, for example, so that the main lens 11 is replaceable. The camera module 10 is not limited thereto, and can be configured as a unit in which the imaging optical system including the main lens 11 and the microlens array 12 are housed in a housing. In this case, the unit including the imaging optical system and the microlens array 12 is replaceable.

The imager 14 includes a drive circuit for driving the pixels of the image sensor 13. The drive circuit includes a vertical selection circuit configured to sequentially select pixels to be driven in the vertical direction in units of horizontal lines (rows), a horizontal selection circuit configured to sequentially select pixels in units of columns, and a timing generator configured to drive the vertical selection circuit and the horizontal selection circuit with various pulses. The imager 14 reads charge resulting from photo-electric conversion of received light from the pixels selected by the vertical selection circuit and the horizontal selection circuit, converts the charge into an electric signal, and outputs the signal.

The signal processor 15 performs a gain adjustment process, a denoising process, an amplification process, and the like on the electric signal that is an analog signal output from the imager 14. In addition, the signal processor 15 includes an analog-to-digital (A/D) converting circuit to convert the signal resulting from the processes into a digital signal and output the signal as an image signal for a RAW image.

The ISP 20 includes a camera module I/F 21, a memory 22, an image processor 23, and an output I/F 24. The camera module I/F 21 is a signal interface with respect to the camera module 10. The image signal for a RAW image (hereinafter referred to as a RAW image) output from the signal processor 15 of the camera module 10 is stored in the memory 22 that is a frame memory, for example, via the camera module I/F 21.

The image processor 23 performs a refocusing process of enlarging an image in an area associated with the microlenses as will be described later and overlaying the image at a shifted position on the basis of the RAW image based on light passing through the microlens array 12 and the color filter array from among RAW images stored in the memory 22 to obtain a refocused image that is reconstructed. The refocused image is output through the output I/F 24, and displayed on a display device, which is not illustrated, or stored in an external storage medium.

Note that the RAW images stored in the memory 22 may be stored in an external storage medium. In this case, a RAW image read from the external storage medium can be stored in the memory 22 via the camera module I/F 21, for example, and subjected to the refocusing process by the image processor 23 to obtain a refocused image at desired timing.

Optical System Applicable to Embodiment

Figure 2:
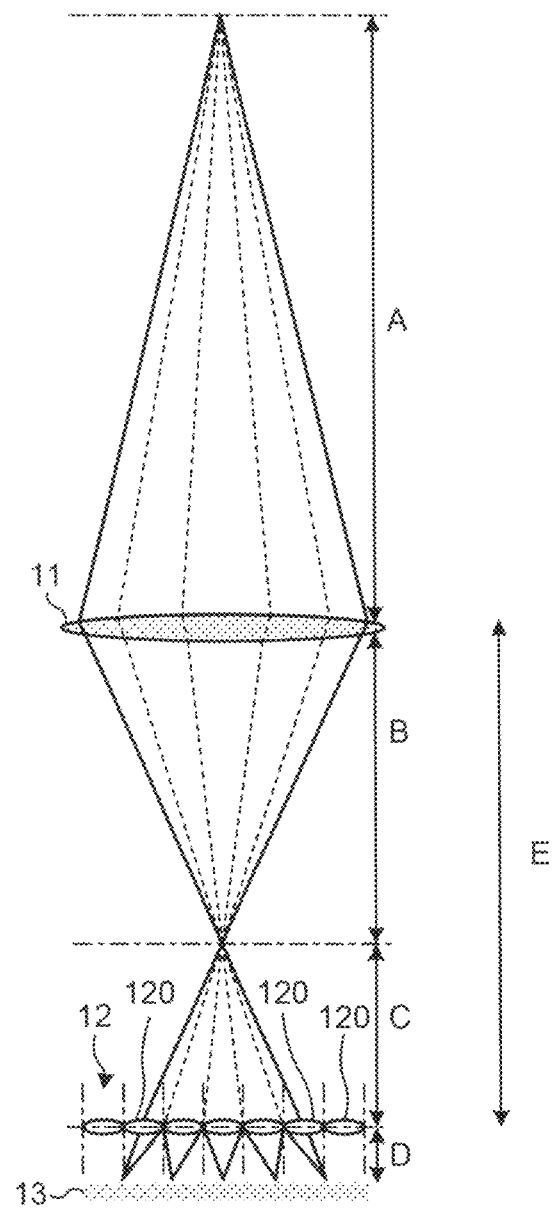
FIG. 2 is a diagram illustrating an example configuration of an optical system that can be applied to the embodiment.

Next, an optical system that can be applied to the embodiment will be described. The optical system includes the main lens 11, the microlens array 12, and the image sensor 13. FIG. 2 illustrates an example configuration of the optical system that can be applied to the embodiment. In FIG. 2, a distance A represents the distance between the main lens 11 and the object, and a distance B represents the imaging distance of the main lens 11. Furthermore, a distance C represents the shortest distance between the image plane of the main lens 11 and the microlenses of the microlens array 12, and a distance D represents the distance between the microlens array 12 and the image sensor 13. The main lens 11 has a focal length f, and the microlenses 120, 120, . . . have a focal length g. Hereinafter, the side of the object with respect to the optical axis is defined as front and the side of the image sensor 13 is defined as rear for explanation.

In the optical system, the microlens array 12 focuses light beams from the main lens 11 on the image sensor 13 as an image at respective points of view through the microlenses 120, 120, . . . . Although not illustrated, the color filters of R, G and B are arranged corresponding to the microlenses 120, 120, . . . , respectively.

Figure 3:
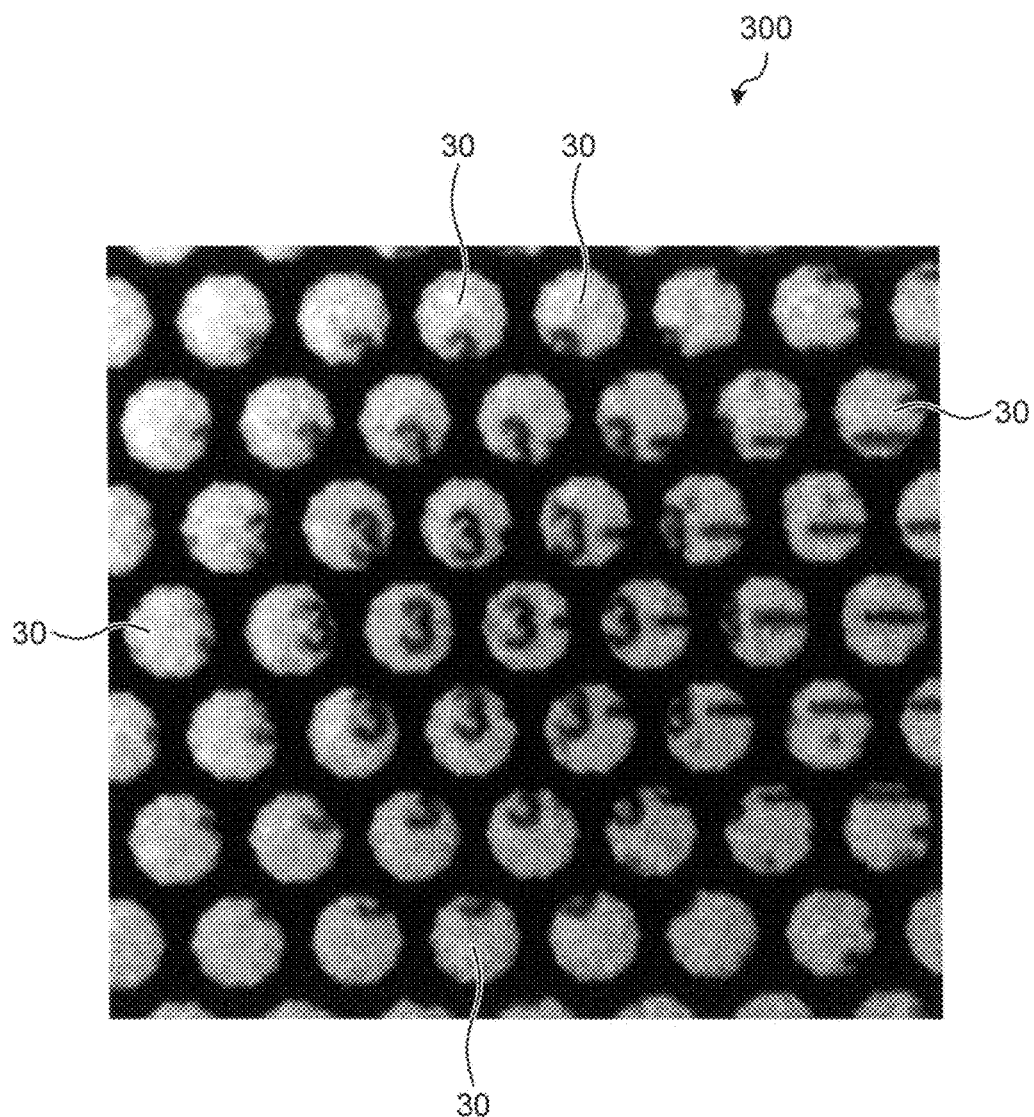
FIG. 3 is a schematic view of an example of a RAW image according to the embodiment.

FIG. 3 schematically illustrates an example of a RAW image based on the output from the image sensor 13 when the image plane of the main lens 11 is at the rear of the image sensor 13 according to the embodiment. An image 300 in which microlens images 30, 30, . . . focused on the light receiving surface of the image sensor 13 by the microlenses 120, 120, . . . of the microlens array 12 are arranged correspondingly to the arrangement of the microlenses is output as a RAW image from the signal processor 15. According to FIG. 3, one object (the number "3", for example) is imaged into microlens images 30 that are shifted from one another by a predetermined amount correspondingly to the arrangement of the microlenses 120, 120, . . . .

Note that the microlens images 30, 30, . . . are preferably focused on the image sensor 13 by the microlenses 120, 120, . . . without overlap. Furthermore, although the microlens array 12 is a hexagonal array in which the microlenses 120, 120, . . . are arranged on lattice points of a hexagonal lattice in FIG. 3, the array of the microlenses 120, 120, . . . is not limited to this example but may be a different array. For example, the microlenses 120, 120, . . . may be arranged in a square lattice.

Figure 4:
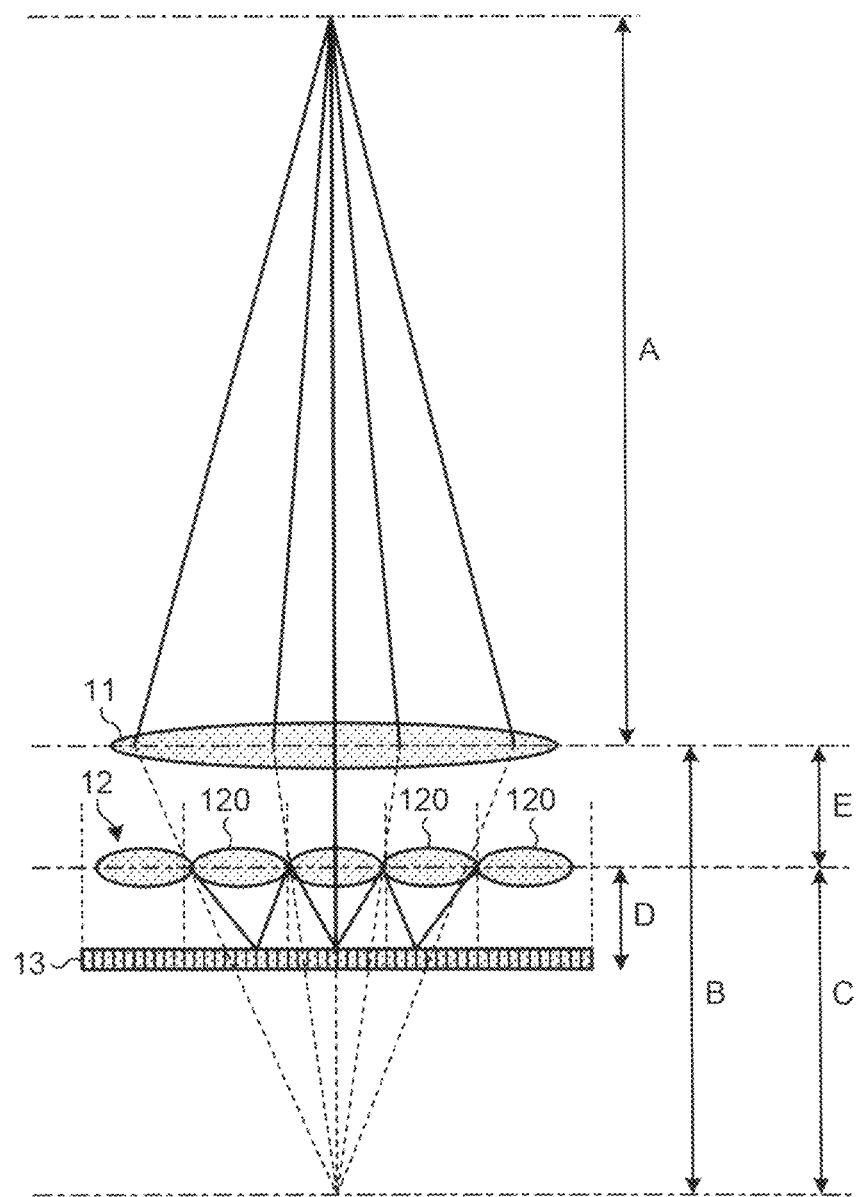
FIG. 4 is a diagram illustrating another example configuration of an optical system that can be applied to the embodiment.

In the example of FIG. 2, the microlens array 12 is placed at the rear of the image plane of the main lens 11. This is not limited to the example, but the microlens array 12 may be placed in front of the image plane of the main lens as illustrated in FIG. 4, for example. In the following, it is assumed that the microlens array 12 in the optical system is placed at the rear of the main lens 11 as illustrated in FIG. 2.

Next, the principle of formation of a refocused image will be described with reference to FIG. 2 described above. In FIG. 2, the distance B plus the distance C is represented by a distance E. The distance E is a constant if the position of the main lens 11 is fixed. Herein, the description will be made on the assumption that the distance E and the distance D are constants.

Regarding the main lens 11, the distance A to the object, the distance B at which light from the object is focused, and the focal length f satisfy the relation expressed by Equation (1) according to the lens equation. Similarly, regarding the microlenses 120, 120, . . . of the microlens array 12 also satisfy the relation expressed by Equation (2) according to the lens equation.

$$\frac{1}{A} + \frac{1}{B} = \frac{1}{f} \quad (1)$$

$$\frac{1}{C} + \frac{1}{D} = \frac{1}{g} \quad (2)$$

When the distance A between the main lens 11 and the object changes, the value of the distance B of the lens equation of Equation (1) changes. Since the distance B plus the distance C equals the distance E as described above and the distance E is fixed on the basis of the positional relation of the optical system, the value of the distance C changes as the distance B changes. When the lens equation of Equation (2) described above is applied to the microlenses 120, 120, . . . , it can also be seen that the value of the distance D changes as the distance C changes.

As a result, the image focused through the microlenses 120, 120, . . . is an image obtained by reducing the image plane that is a virtual image of the main lens 11 at a rate N (N=D/C). The rate N can be expressed as the following Equation (3).

$$N = \frac{D}{C} = \frac{D}{E-B} = \frac{\frac{Cg}{C-g}}{E - \frac{Af}{A-f}} = \frac{Cg(A-f)}{(C-g)\{E(A-f) - Af\}} \quad (3)$$

Figure 5:
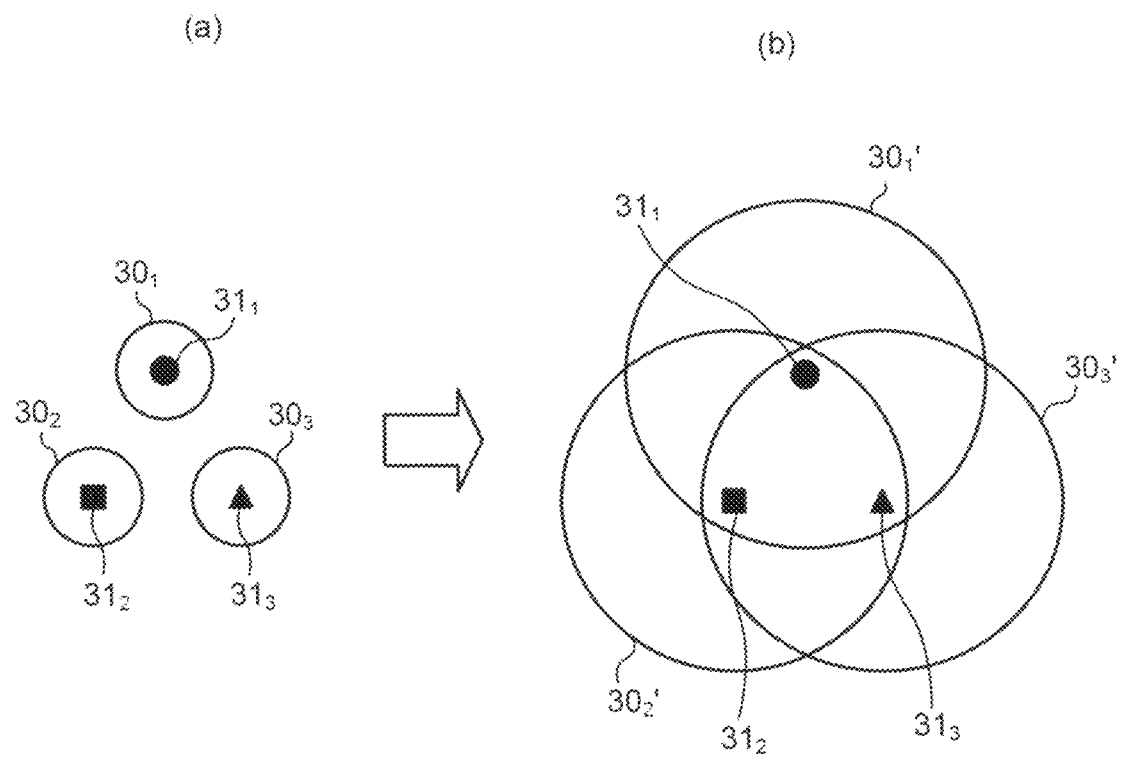
FIG. 5 illustrates a refocusing process according to the embodiment.

Equation (3) shows that the reduction rate of the image on the image sensor 13 with the microlenses 120, 120, . . . is dependent on the distance A from the main lens 11 to the object. Thus, to reconstruct the original two-dimensional image, the microlens images $30_1$, $30_2$, and $30_3$ with center coordinates $31_1$, $31_2$, and $31_3$, respectively, formed through the microlenses 120, 120, . . . , for example, illustrated in (a) in FIG. 5 are enlarged at a magnification of 1/N as illustrated in (b) in FIG. 5 to form enlarged microlens images $30_1'$, $30_2'$, and $30_3'$. The enlarged microlens images $30_1'$, $30_2'$, and $30_3'$ are then combined by overlaying the images, so that a reconstructed image in focus at the distance A can be obtained.

The enlarged microlens images $30_1'$, $30_2'$, and $30_3'$ are overlaid in a manner that the images are shifted from one another at distances other than the distance A, which can produce an effect like blurring. The process of focusing the imaged microlens images at a certain position in this manner is called a refocusing process.

Color Filter Array According to Embodiment

Figures 6, 7:
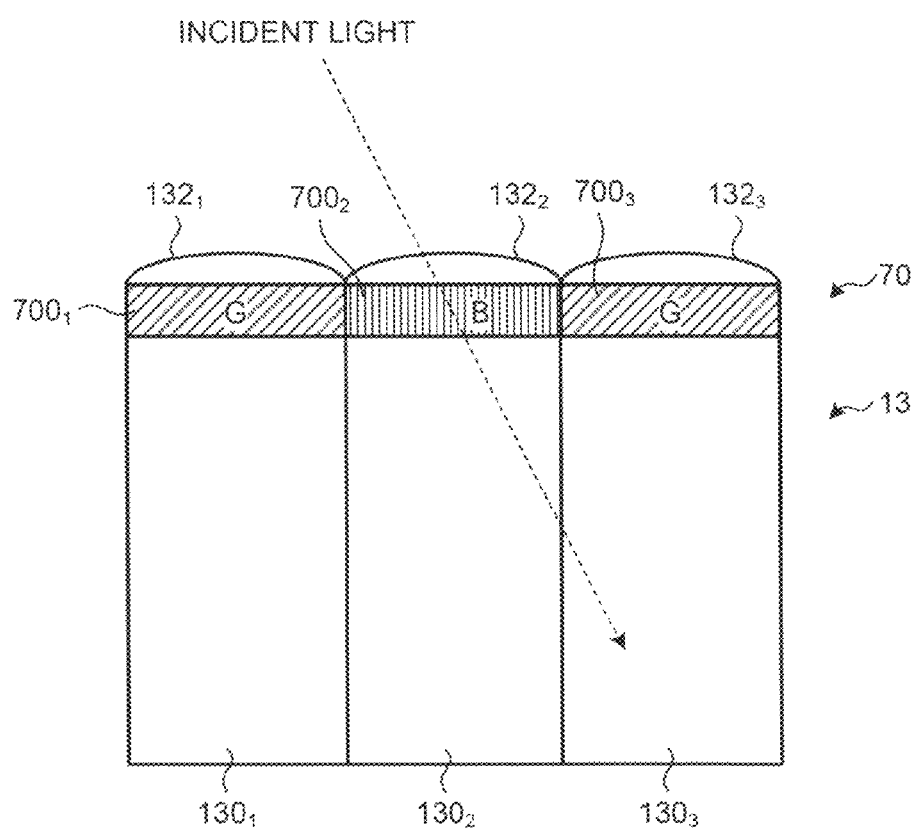
FIG. 6 is a diagram illustrating an example of a color filter array of the Bayer array.
FIG. 7 is a diagram illustrating an example configuration of an image sensor according to a known arrangement.

Next, a color filter array according to the embodiment will be described. First, a known color filter array will be described with reference to FIGS. 6 and 7. FIG. 6 illustrates an example of a commonly-used color filter array 70 of the Bayer array. In the color filter array 70 of the Bayer array, color filters of R, G, and B are arranged in a matrix in which a row of a repetition of G, B, G, B, . . . and a row of a repetition of R, G, R, G are arranged alternately as illustrated in FIG. 6.

FIG. 7 illustrates a cross section of an example configuration of an image sensor 13 according to a known configuration. In the example of FIG. 7, a color filter $700_1$ of G, a color filter $700_2$ of B, and a color filter $700_3$ of G in the color filter array 70 of the Bayer array are provided for pixels $130_1$, $130_2$, and $130_3$ of the image sensor 13, respectively. In this example, lenses $132_1$, $132_2$, and $132_3$ are provided for each pixel for the color filters $700_1$, $700_2$, and $700_3$, respectively.

As illustrated in FIG. 2, etc., when an optical system that irradiate the image sensor 13 with light from the main lens 11 through the microlens array 12 is used, the entrance angle with respect to the image sensor 13 is larger as the light is directed outward of the image sensor 13 farther from the optical axis of the main lens 11. Thus, as illustrated in FIG. 7, light incident on the pixel $130_2$ at an angle through the color filter $700_2$ of B may also be incident on the adjacent pixel $130_3$, for example.

In this case, light passing through the color filter $700_2$ of B from the pixel $130_2$ is incident on the pixel $130_3$ and light passing through the color filter $700_3$ of G provided for the pixel $130_3$ is directly incident on the pixel $130_3$. As a result, crosstalk between pixels may occur at the pixel $130_3$, which may degrade the color reproducibility of the captured image.

Figure 8:
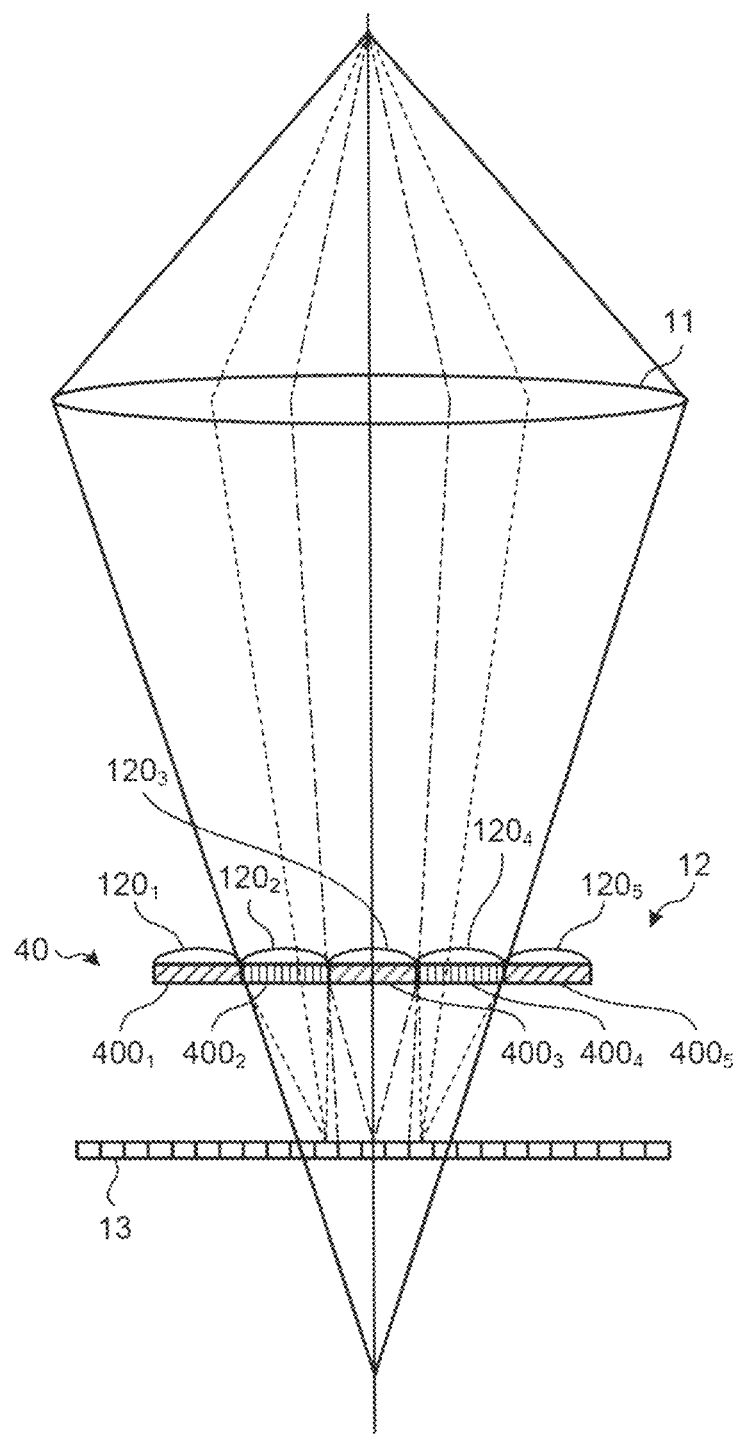
FIG. 8 is a diagram illustrating an example configuration of an optical system according to the embodiment.

FIG. 8 illustrates an example configuration of an optical system according to the embodiment. The configuration illustrated in FIG. 8 corresponds to that in FIG. 4 described above, and parts that are the same as in FIG. 4 will be designated by the same reference numerals and detailed description thereof will not be repeated.

In the embodiment, a color filter array 40 including color filters $400_1$, $400_2$, . . . for the respective colors, corresponding to the microlenses $120_1$, $120_2$, . . . , respectively, is provided in the optical system. In the example of FIG. 8, the color filter $400_1$ of R is provided for the microlens $120_1$ and the color filter $400_2$ of G is provided for the microlens $120_2$, for example. Furthermore, the color filter $400_3$ of R is provided for the microlens $120_3$, and similarly, the color filters $400_4$ and $400_5$ are provided for the microlenses $120_4$ and $120_5$, respectively.

Figure 9A:
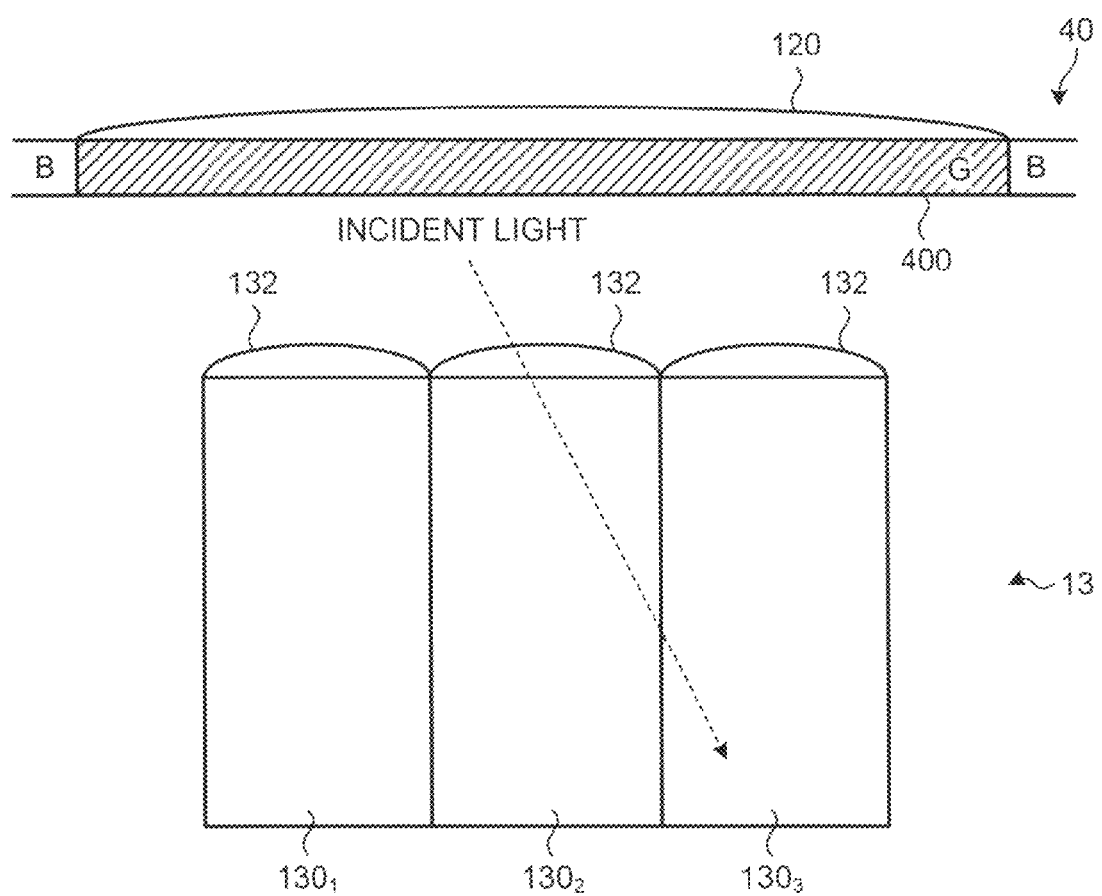
FIG. 9A is a diagram illustrating an example configuration of an image sensor according to the embodiment.

In FIG. 9A, illustrates a cross section of an example configuration of the image sensor 13 according to the embodiment. In FIG. 9A, parts that are the same as in FIG. 7 will be designated by the same reference numerals and detailed description thereof will not be repeated. In the embodiment, as illustrated in FIG. 9A, one color filter 400 of one color (G, for example) included in the color filter array 40 is associated with one microlens 120. Thus, the pixels $130_1$, $130_2$, and $130_3$ receiving light from the microlenses 120 all receive light of the same color (G, for example) passing through the same color filter 400.

In this case, light incident at a given angle on the pixel $130_2$ is also incident in the adjacent pixel $130_3$, for example, which again causes crosstalk between pixels at the pixel $130_3$. However, since light directly incident on the pixel $130_3$ is light passing through the same color filter 400 as light incident at an angle from the adjacent pixel $130_2$, degradation in color reproducibility due to crosstalk between pixels can be avoided.

Although the color filter array 40 is illustrated as being provided adjacent to the microlens array 12 in FIG. 9A, this is not limited to the example. For example, the microlens array 12 and the color filter array 40 may be provided separately. Furthermore, although the microlens array 12 is provided on the side of the main lens 11 and the color filter array 40 is provided on the side of the image sensor 13 in the example of FIG. 9A, the microlens array 12 may be provided on the side of the image sensor 13 and the color filter array 40 may be provided on the side of the main lens 11.

Figure 9B:
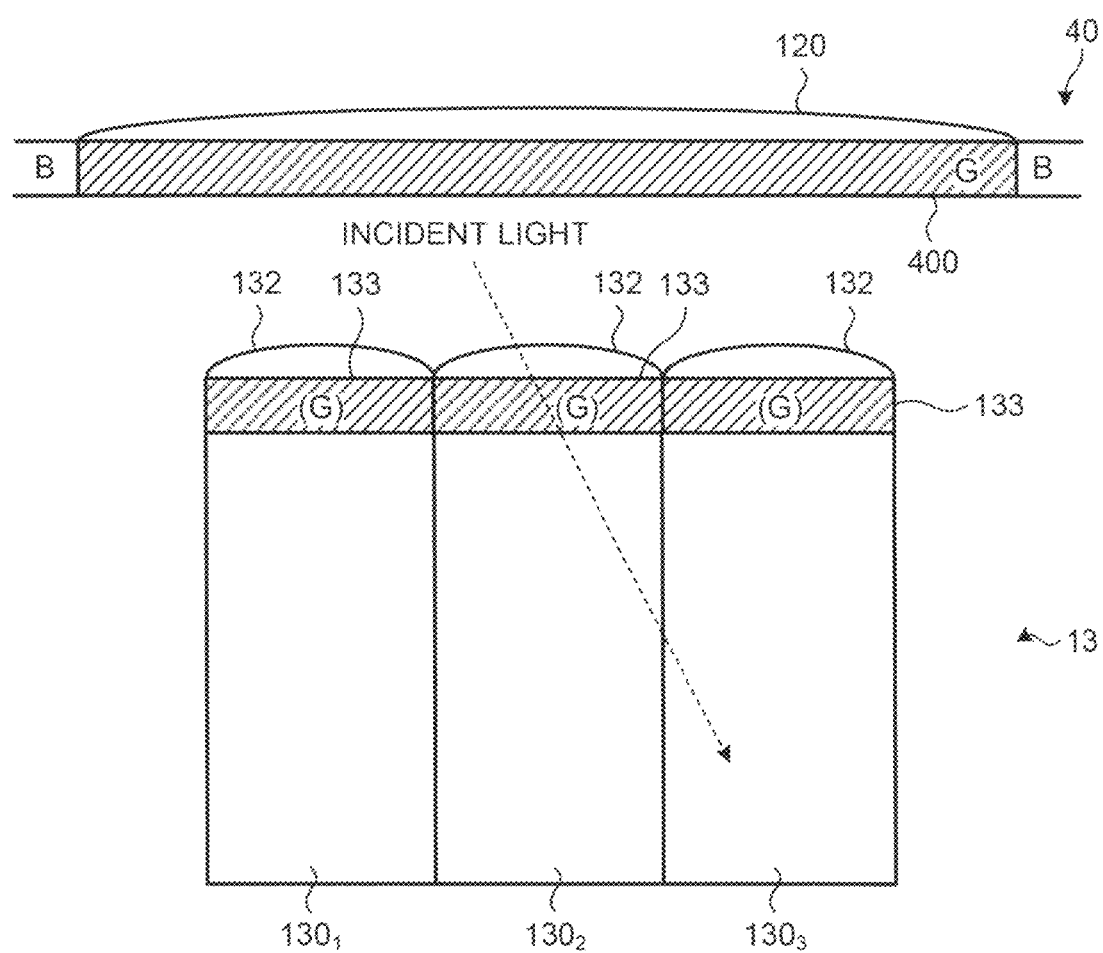
FIG. 9B is a diagram illustrating another example configuration of an image sensor according to the embodiment.

Furthermore, although the color filters 400 are arranged only in units of microlenses 120 in the example of FIG. 9A, this is not limited to the example. For example, as illustrated in FIG. 9B, color filters 133 on pixels provided in units of pixels over the pixels $130_1$, $130_2$, and $130_3$ may be combined. In this manner, light entering from other microlenses can be suppressed and light reproducibility can further be improved.

Figure 10:
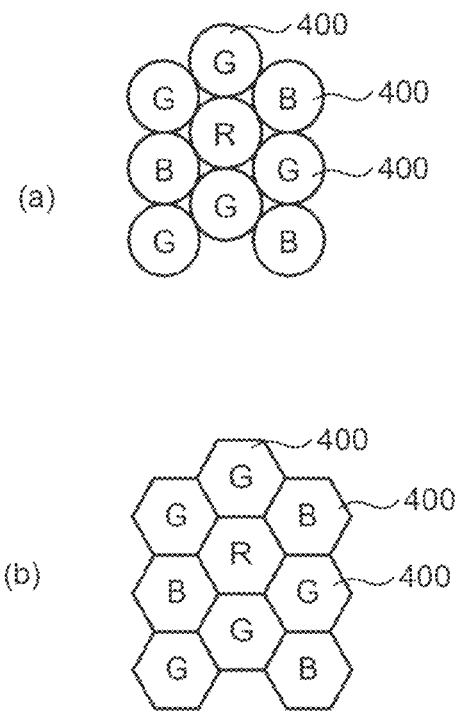
FIG. 10 illustrates examples of the shape of color filters according to the embodiment.

FIG. 10 illustrates examples of the shape of the color filters 400 included in the color filter array 40 according to the embodiment. In FIG. 10, (a) is an example in which the shape of the color filters 400, 400, ... is a circle. In FIG. 10, (b) is an example in which the shape of the color filters 400, 400, ... is a hexagon. Thus, the shape of the color filters 400, 400, ... may be any shape that can cover the microlenses 120, 120, ... when the color filters 400, 400, ... are arranged in a hexagonal array.

Figure 11:
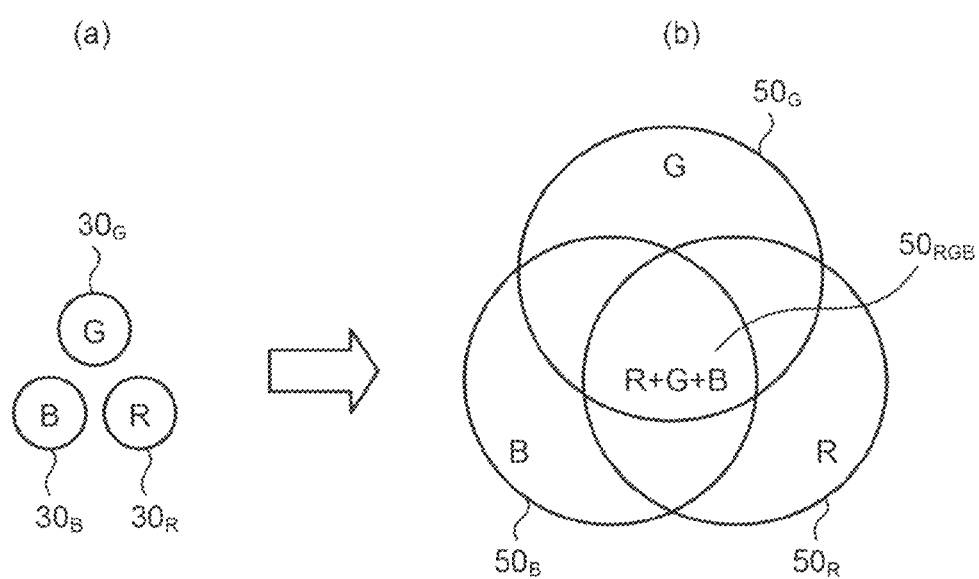
FIG. 11 illustrates processing performed by an image processor according to the embodiment.

Microlens images 30 obtained when light passing through the color filter array 40 and the microlens array 12 reaches the image sensor 13 are monochromatic microlens images $30_R$, $30_G$, and $30_B$ of R, G, or B as illustrated in (a) in FIG. 11. The image processor 23 performs a refocusing process on a RAW image including the microlens images $30_R$, $30_G$, and $30_B$ by enlarging and overlaying the microlens images $30_R$, $30_G$, and $30_B$ as illustrated in FIG. 5.

Specifically, as illustrated in (b) in FIG. 11, the image processor 23 enlarges the microlens images $30_R$, $30_G$, and $30_B$ to generate enlarged microlens images $50_R$, $50_G$, and $50_B$. An overlaid area $50_{RGB}$ obtained by overlaying the enlarged microlens images $50_R$, $50_G$, and $50_B$ is a color image containing R, G, and B. The image processor 23 can obtain a two-dimensional reconstructed color image by synthesizing color images on the overlaid area $50_{RGB}$.

Color Filter Arrangement

Next, an arrangement of color filters of the respective colors included in the color filter array 40 will be described. Since there are several arrangements of the color filters 400 of the respective colors included in the color filter array 40, the arrangements will be classified. In the following, the arrangements of color filters in the color filter array 40 will be expressed by smallest units of repetition.

Figure 12:
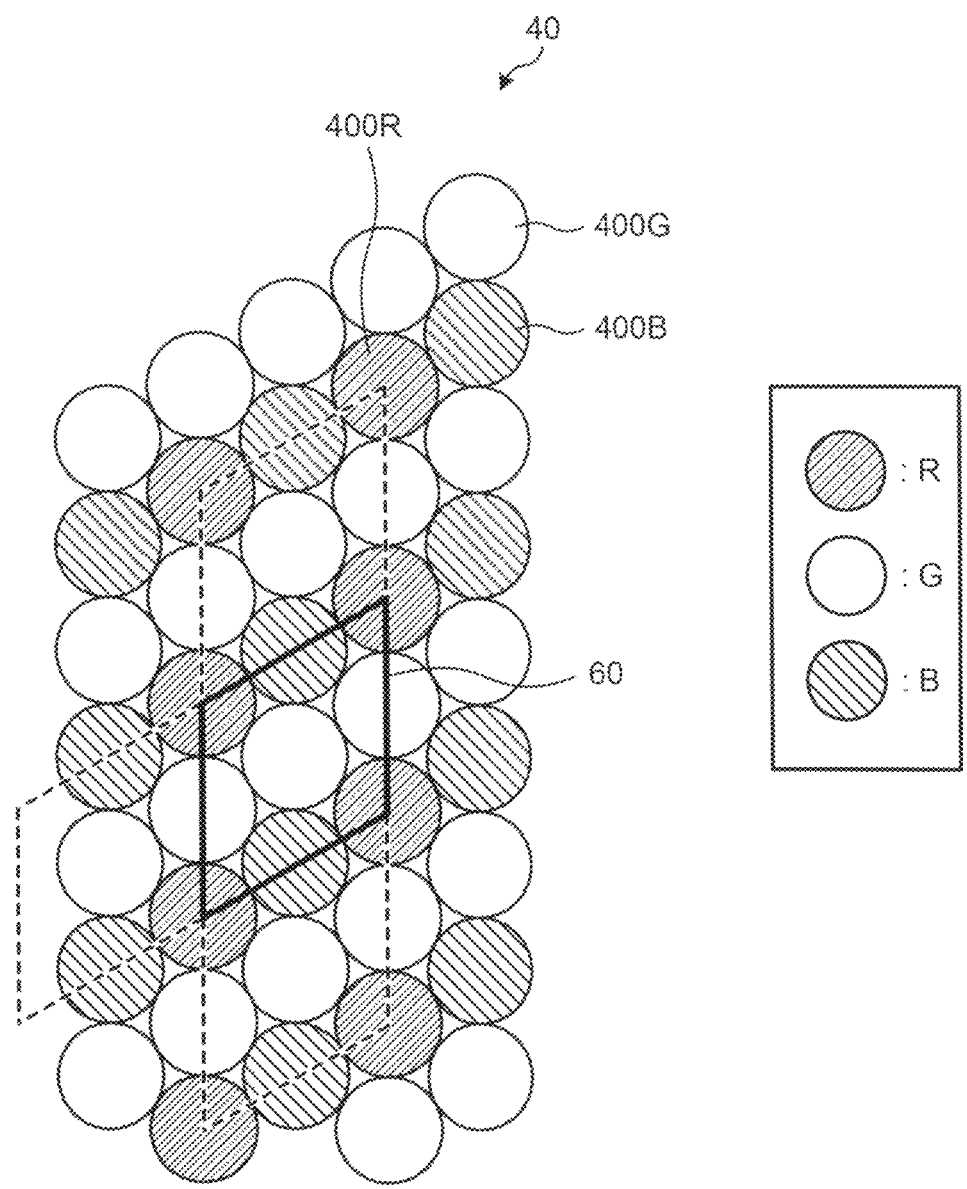
FIG. 12 is a diagram for explaining the smallest units of repetition according to the embodiment.

The smallest units of repetition according to the embodiment will be described with reference to FIG. 12. In FIG. 12 and subsequent similar figures, color filters 400R, 400G, and 400B of R, G, and B, respectively, are distinguished from one another by the presence and absence of hatched lines and the patterns of hatched lines. FIG. 12 illustrates an example in which the color component ratio of R, G, and B in the color filter array 40 is 1:2:1, and a region 60 surrounded by a frame is the smallest unit of repetition. Specifically, the arrangement illustrated in FIG. 12 is an arrangement in which the arrangement in the region 60 is closely spread.

In the arrangement of the color filters 400R, 400G, and 400B in the color filter array 40 of a hexagonal array, the smallest reconstruction magnification and the distance accuracy are important. The smallest reconstruction magnification refers to the smallest magnification at which the microlens images $30_R$, $30_G$, and $30_B$ of the respective colors are enlarged to generate enlarged microlens images $50_R$, $50_G$, and $50_B$ so that a region 60 that is the smallest unit of repetition in a reconstructed image obtained by overlaying the enlarged microlens images $50_R$, $50_G$, and $50_B$ contains all the color components (the color components of R, G, and B, for example) constituting a color image. Thus, a color image including the respective colors of R, G, and B in all the pixels contained in the region 60 can be obtained by enlarging the microlens images $30_R$, $30_G$, and $30_B$ of the respective colors at a magnification equal to or larger than the smallest reconstruction magnification.

Figure 13:
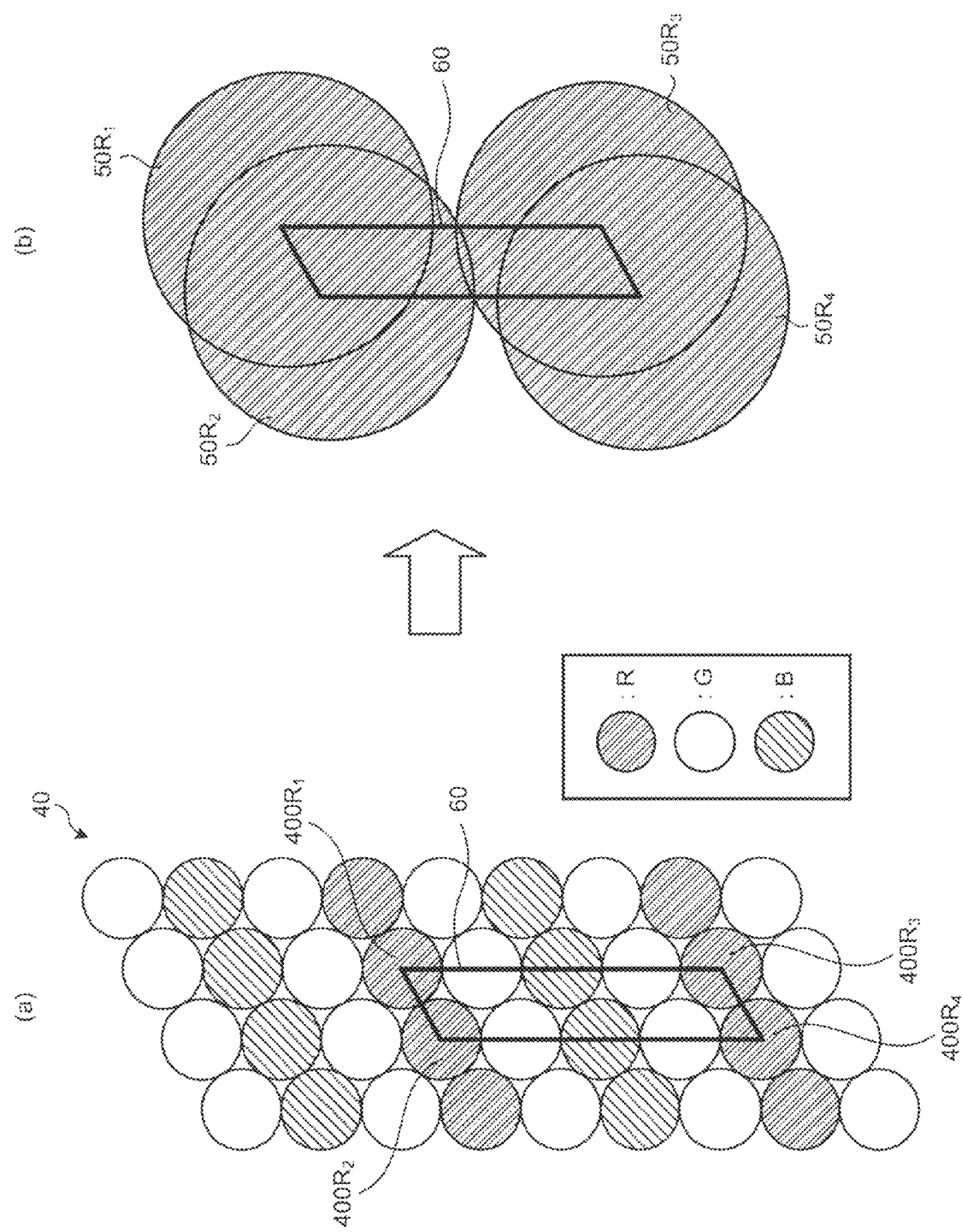
FIG. 13 illustrates the smallest reconstruction magnification according to the embodiment.

The smallest reconstruction magnification according to the embodiment will be described more specifically with reference to FIG. 13. In FIG. 13, (a) illustrates an example of an arrangement in which the color component ratio of R, G, and B in the color filter array 40 is 1:2:1. Focusing on color filters $400R_1$ to $400R_4$ at the four corners of the region 60 that is the smallest unit of repetition illustrated in (a) in FIG. 13, an example of enlarged microlens images $50R_1$ to $50R_4$ obtained by enlarging the microlens images at the smallest reconstruction magnification by the color filters $400R_1$ to $400R_4$ is illustrated in (b) in FIG. 13.

In the example of FIG. 13B, it can be seen that the enlarged microlens images $50R_1$ to $50R_4$ of R at the four corners cover the entire region 60 and that the region 60 is covered by the respective components of R, G, and B. Since the resolution of the reconstructed image is decreased in inverse proportion to the square of the smallest reconstruction magnification, a reconstructed image with higher resolution can be obtained as the smallest reconstruction magnification is smaller.

Next, the distance accuracy will be described. As already described with reference to Equation (3), since the values of the distances B, C, and D change as the value of the distance A changes in FIG. 2, the reduction rate N of the microlens images also changes.

Note that Equation (3) is rearranged into the following Equation (4). The reduction rate N of the images by the microlenses 120 can be calculated by using image matching or the like, and the value of the distance A can be calculated from Equation (4) if the distances D and E and the focal length f are known.

$$A = \frac{(D-NE)f}{D-NE+Nf} \quad (4)$$

In the case of the optical system illustrated in FIG. 4, the distance E plus the distance C equals the distance B, and the lens equation relating to the microlenses 120 is expressed by the following Equation (5). The relation between the distance A and the reduction rate N can thus be expressed by the following Equation (6).

$$-\frac{1}{C} + \frac{1}{D} = \frac{1}{g} \quad (5)$$

$$A = \frac{(D+NE)f}{D+NE-Nf} \quad (6)$$

When the shifted amount of the microlens images 30 between the microlenses 120 is represented by a value Δ' and the distance between centers of the microlenses 120 is represented by a value L, the reduction rate N is expressed by the following Equation (7) based on the geometric relation of light beams. Thus, for obtaining the reduction rate N, the image processor 23 may obtain the shifted amount Δ' between microlenses 120 by performing an image matching process on the microlens images 30 by using an evaluation function such as the sum of absolute difference (SAD) and the sum of squared difference (SSD).

$$N = \frac{\Delta'}{L} \quad (7)$$

When the color filter array 40 according to the embodiment is used, the image processor 23 performs image matching between microlens images 30 obtained with the color filters of the same color. In this case, a significant error may be caused in the distance accuracy of the shifted amount $\Delta'$ obtained by image matching due to the distance to the object and the edge direction of the image depending on the arrangement of the color filters of the respective colors in the color filter array 40.

To suppress the error in the distance accuracy, the arrangement of the color filters of the respective colors in the color filter array 40 needs to satisfy first and second conditions described below.

The first condition will be described. For example, assume a case in which no color filters of the same color are present near a certain color filter in the color filter array 40. In this case, as described above, since the shifted amount $\Delta'$ between the microlens images 30 is dependent on the distance A to the object, distance cannot be measured if there is no color filter of the same color in the vicinity when the object is only imaged between microlenses 120 that are close to each other. Thus, a color filter of the same color needs to be present in the vicinity of each color filter. This is the first condition.

In this case, the vicinity refers to within a range of the region 60 of the smallest unit of repetition in the color filter arrangement described above.

Figure 14:
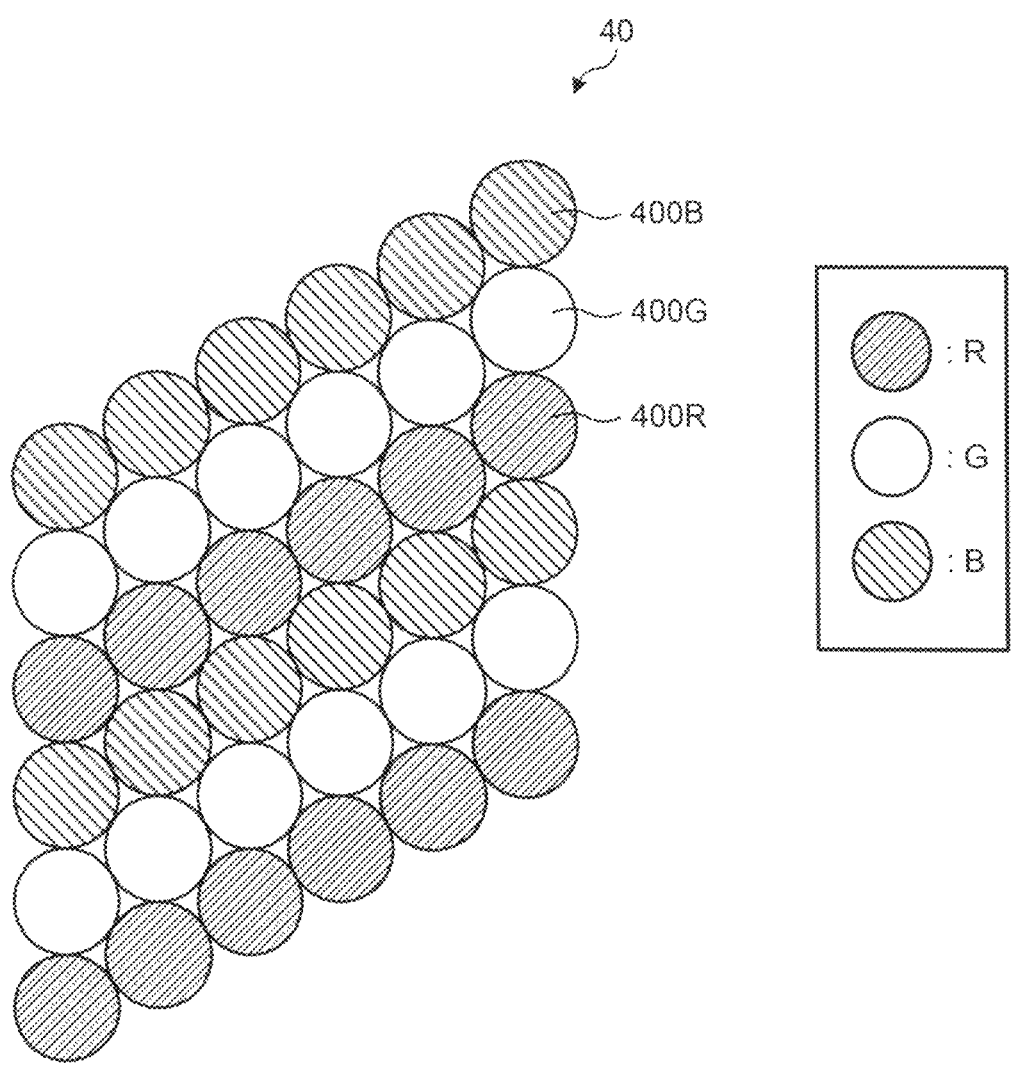
FIG. 14 is a diagram for explaining directional dependency of the distance accuracy of a color filter arrangement.

The second condition will be described. The second condition is a condition on the directional dependency of the distance accuracy of the color filter arrangement. FIG. 14 illustrates an example of an arrangement in which color filters of the same color in the vicinity of a color filter are present only in one axial direction. Specifically, in the example of FIG. 14, color filters 400R, 400G, and 400B of R, G, and B, respectively, are arranged in straight lines each of the same color.

In this arrangement, the matching accuracy may be decreased when a part at which the luminance value changes such as an edge of an object image is in parallel with the axial direction along which the color filters of the same color are arranged. Specifically, the image processor 23 performs an image matching process by using the microlens images 30 obtained through the color filters of the same color. Thus, when an edge of the image is present in parallel to the axial direction along which color filters of the same color are arranged, for example, microlens images 30 adjacent to each other in the axial direction can be images that are substantially the same. In this case, distance measurement using the image matching is difficult.

As described above, when color filters of the same color are arranged in one axial direction, the directional dependency that the distance accuracy is dependent on the direction of the edge of the object is caused. Therefore, to reduce the directional dependency of the distance accuracy on the edge direction in the image matching, the arrangement of the color filters in the color filter array 40 is preferably determined so that color filters of the same color are present in multiple axial directions. This is the second condition.

Figure 15:
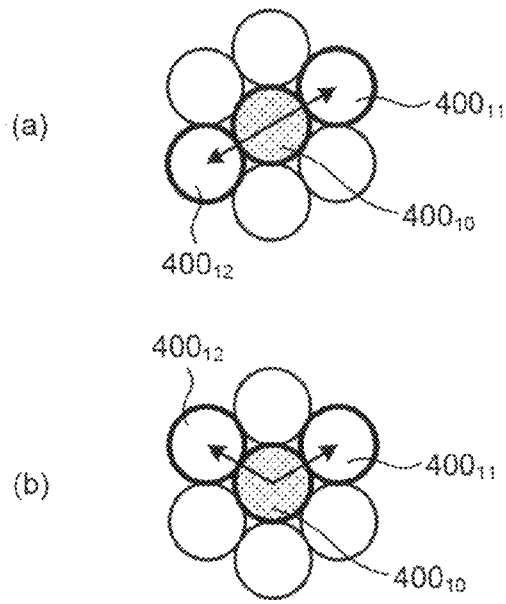
FIG. 15 illustrates a color filter arrangement according to the embodiment.

Specifically, in the arrangement illustrated in (a) in FIG. 15, a color filter $400_{10}$ and color filters $400_{11}$ and $400_{12}$ of the same color as the color filter $400_{10}$ are arranged along one axis, and the color filters $400_{10}$, $400_{11}$ and $400_{12}$ do not satisfy the second condition. In this case, as described above, the directional dependency that the distance accuracy is dependent on the edge direction of the object may be caused in the microlens images 30 formed through the color filters $400_{10}$, $400_{11}$ and $400_{12}$.

In contrast, in the arrangement illustrated in (b) in FIG. 15, the color filter $400_{10}$ and the color filters $400_{11}$ and $400_{12}$ of the same color as the color filter $400_{10}$ are not arranged along one axis. Thus, in the example of (b) in FIG. 15, the color filters $400_{11}$ and $400_{12}$ of the same color as the color filter $400_{10}$ have two axes, which are a first axis connecting the color filters $400_{10}$ and $400_{11}$ and a second axis connecting the color filters $400_{10}$ and $400_{12}$, which satisfies the second condition. The arrangement of (b) in FIG. 15 is therefore a more preferable arrangement than the arrangement of (a) in FIG. 15 described above with a smaller directional dependency of the distance accuracy on the edge direction of the object.

Here, consider the periodicity of the arrangement of the color filters in the color filter array 40 in a hexagonal array. In this case, the second condition, that is, the presence of color filters of the same color in different axial directions can be, in other words, a condition that the color filters of the same color as one color filter in the vicinity of the color filter are not present at positions point-symmetric with respect to the color filter.

This can be summarized as a third condition that is a condition for a desirable color filter arrangement in the color filter array 40 in a hexagonal array, in which six color filters adjacent to a color filter of interest are arranged in a manner that color filters of at least one color are arranged non-point-symmetrically with respect to the color filter of interest.

Figure 16:
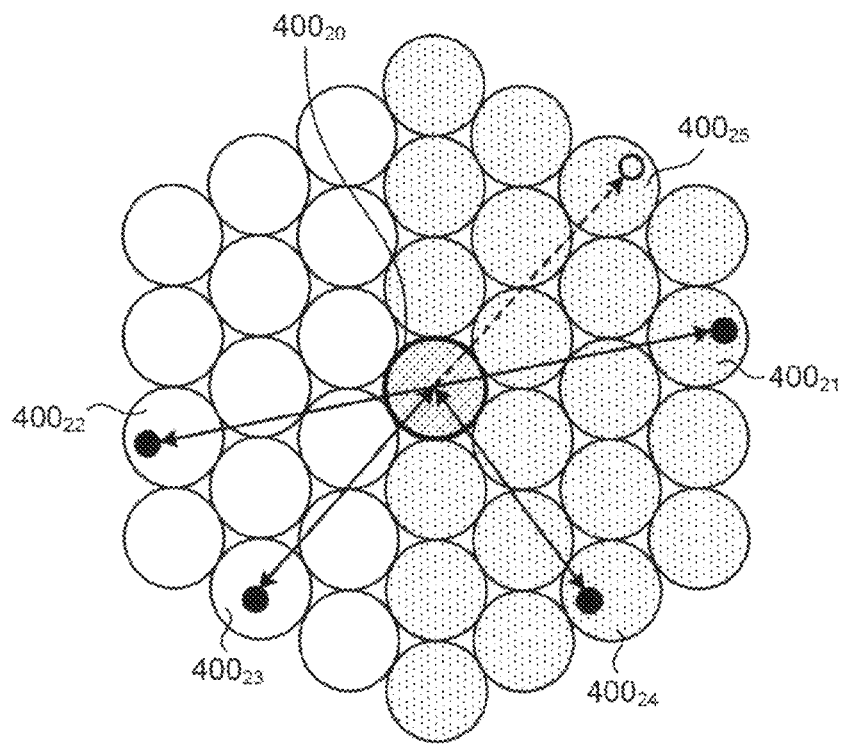
FIG. 16 is a diagram for explaining relative positions of color filters according to the embodiment.

The relative positions of the color filters according to the embodiment will be described more specifically with reference to FIG. 16. In FIG. 16, a range up to third color filters from a color filter is defined as the vicinity for explanation.

In FIG. 16, color filters $400_{20}$ to $400_{25}$ are assumed to be of the same color. When the color filter $400_{20}$ is the center, the color filters $400_{21}$ and $400_{22}$ are at positions point-symmetric with respect to the color filter $400_{20}$, which does not satisfy the third condition. In this case, since calculation for the image matching is performed in one axial direction connecting the color filters $400_{21}$, $400_{20}$, and $400_{22}$, the directional dependency of the distance accuracy on the edge direction of the object becomes high and is therefore not preferable.

In contrast, the color filters $400_{23}$ and $400_{24}$ are not at positions point-symmetric with respect to the color filter $400_{20}$ and thus satisfy the third condition. Calculation for the image matching is thus possible in two axial directions, which as the axial direction connecting the color filters $400_{20}$ and $400_{23}$ and the axial direction connecting the color filters $400_{20}$ and $400_{24}$, which can suppress the directional dependency of the distance accuracy on the edge direction of the object.

Specific Examples of Color Filter Arrangement According to Embodiment

Next, specific examples of the color filter arrangement that satisfies a condition including the first to third conditions and has a preferable smallest reconstruction magnification will be described with reference to FIGS. 17 to 19.

Figure 17:
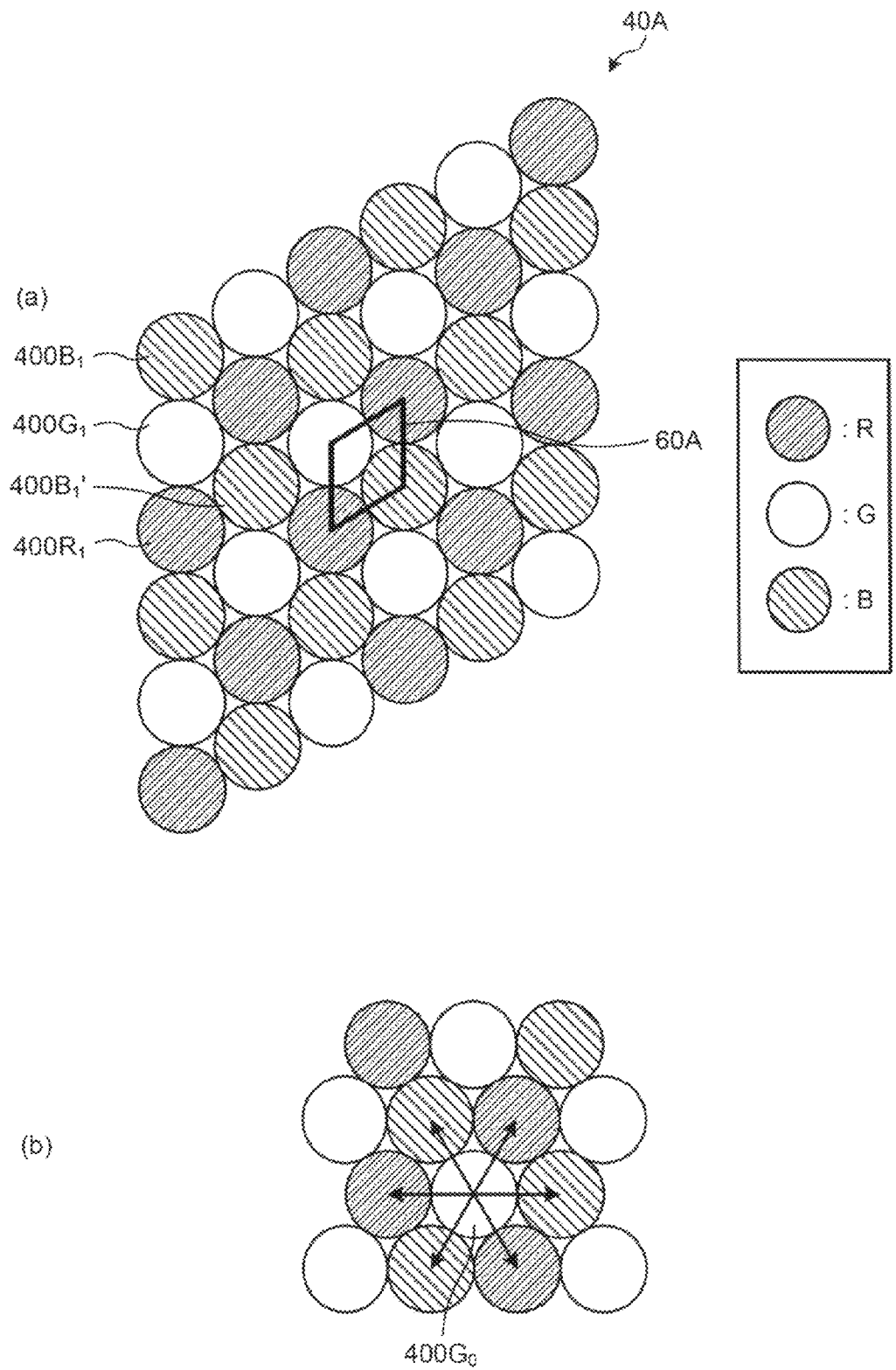
FIG. 17 illustrates specific examples of the color filter array according to the embodiment.

FIG. 17 illustrates an example of a color filter array 40A in which the color component ratio of R, G, and B is 1:1:1. A region 60A that is the smallest unit of repetition in this example The color filter array 40A has a smallest reconstruction magnification of 1/N=2.0.

As illustrated in (a) in FIG. 17, to form the arrangement of the color filter array 40A, a set of one color filter $400B_1$ of B, one color filter $400G_1$ of G, and one color filter $400R_1$ of R sequentially arranged adjacent to one another in a line is repeated, for example. In addition, the set is shifted by 1.5 filters adjacent to the line and repeated with respect to the position of a color filter $400B_1'$ shifted by 1.5 filters from the color filter $400B_1$, for example. In this manner, the arrangement of the color filter array 40A can be formed.

In the arrangement of the filter array 40A, when a color filter $400G_0$ of G is focused on, for example, adjacent color filters of B and R are arranged alternately and the color filter of the same color are non-point-symmetric with respect to the color filter $400G_0$ as illustrated in (b) in FIG. 17. The arrangement thus satisfies the third condition. Furthermore, it is shown that two color filters of the same color come within the region 60A as a result of sequentially shifting the region 60A, and the color filters of R, G, and B thus satisfy the first condition.

FIG. 18 illustrates an example of a color filter array 40B in which the color component ratio of R, G, and B is 1:2:1. A region 60B that is the smallest unit of repetition in this example contains part of four color filters of R, part of three color filters of G, and part of a color filter of B. The color filter array 40B has a smallest reconstruction magnification of 1/N=2.6.

As illustrated in (a) in FIG. 18, to form the arrangement of the color filter array 40B, a set of one color filter $400R_2$ of R, two color filters $400G_{21}$ and $400G_{22}$ of G, and one color filter $400B_2$ of B sequentially arranged adjacent to one another in a line is repeated, for example. In addition, the set is shifted by 1.5 filters adjacent to the line and repeated with respect to the position of a color filter $400R_2'$ shifted by 1.5 filters from the color filter $400R_2$, for example. In this manner, the arrangement of the color filter array 40B can be formed.

In the arrangement of the filter array 40B, when a color filter $400G_0$ of G is focused on, for example, adjacent color filters of B are arranged along one axis and are point-symmetric as shown by a broken arrow as illustrated in (b) in FIG. 18. The color filters of G and R, however, are non-point-symmetric. The arrangement thus satisfies the third condition. Furthermore, it is shown that two or more color filters of the same color come within the region 60B as a result of sequentially shifting the region 60B upward by one filter, for example, and the color filters of R, G, and B thus satisfy the first condition.

FIG. 19 illustrates an example of a color filter array 40C in which the color component ratio of R, G, and B is 1:3:1. A region 60C that is the smallest unit of repetition in this example contains part of one color filter of R, part of seven color filters of G and part of two color filters of B. The color filter array 40C has a smallest reconstruction magnification of 1/N=2.8.

As illustrated in (a) in FIG. 19, to form the arrangement of the color filter array 40C, a set of one color filter $400R_3$ of R, three color filters $400G_{31}$, $400G_{32}$ and $400G_{33}$ of G, and one color filter $400B_3$ of B sequentially arranged adjacent to one another in a line is repeated, for example. In addition, the set is shifted by 1.5 filters adjacent to the line and repeated with respect to the position of a color filter $400R_3'$ shifted by 1.5 filters from the color filter $400R_3$, for example. In this manner, the arrangement of the color filter array 40C can be formed.

In the arrangement of the color filter array 40C, when a color filter $400R_0$ of R is focused on, for example, adjacent color filters 400 of G as a set are arranged along one axis and are point-symmetric as shown by a broken arrow as illustrated in (b) in FIG. 19. The color filters of B, however, are non-point-symmetric. The arrangement thus satisfies the third condition. Furthermore, it is shown that two or more color filters of the same color come within the region 60C as a result of shifting the region 60C upward by one filter, for example, and the color filters of R, G, and B thus satisfy the first condition.

As described above, use of the color filter arrays 40A to 40C illustrated in FIGS. 17 to 19 allows a reconstructed image with high resolution to be obtained in the refocusing process and can suppress the directional dependency of the distance accuracy on the direction of an edge of the object.

Other Examples of Color Filter Array

Although examples in which the color filter array 40 includes color filters 400 of three colors R, G, and B are described above, the configuration of the color filter array that can be applied to the embodiment is not limited to the examples. For example, a color filter array in which complementary color filters of C (cyan), M (magenta), and Y (yellow) are combined may be used.

Furthermore, in the examples in which color filters of R, G, and B are used, a region of a color filter of G may be a region without any color filters or a colorless filter region (hereinafter referred to as a white component region). In this case, light passing through the white component region becomes white light containing R, G, and B. The image processor 23 can generate a reconstructed image of the G component by subtracting the sum of the luminance value of a reconstructed image of the R component (enlarged microlens image $50_R$) and the luminance value of a reconstructed image of the B component (enlarged microlens image $50_B$) from the luminance values of pixels of a reconstructed image in the white component region in the overlaid area $50_{RGB}$ illustrated in (b) in FIG. 11 in forming a reconstructed image through the refocusing process. A color filter to be replaced with the white component region is not limited to a color filter of G, but may be either a color filter of R or B.

Although the color filter array 40 is described above as including color filters 400 of three colors R, G, and B, but the color filter array 40 is not limited to the example. For example, in an environment in which colors are limited, a color filter array may be formed by color filters of R and color filters of G. Furthermore, a color filter array may be formed by using color filters of four or more colors. In this case, the accuracy of color differentiation can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A color filter array comprising a plurality of color filters of multiple colors, wherein
the color filters are arranged so that the color filter of each
color corresponds to any one of a plurality of microlenses included in a microlens array, each microlens being configured to irradiate a plurality of pixels with light, wherein the color filters are arranged in a hexagonal lattice, and a set of one color filter of a first color, two color filters of a second color, and one color filter of a third color sequentially arranged adjacent to one another in a line is repeated along the line, and the set is repeated adjacent to the line with a shifted amount of 1.5 filters.

2. The color filter array according to claim 1, wherein the color filters are arranged in a manner that at least two color filters of a same color from among the color filters arranged adjacent to one color filter are arranged non-point-symmetrically with respect to the one color filter.

3. The color filter array according to claim 1, wherein the color filters are arranged in a manner that at least one first filter of a same color is arranged in a vicinity of a second color filter of the same color.

4. The color filter array according to claim 1, wherein the color filters have an arrangement in which color filters of two or more colors are arranged adjacent to one another and in a line.

5. The color filter array according to claim 1, wherein the color filters include color filters of two or more colors.

6. The color filter array according to claim 1, wherein the color filters have a region where any color filters are not arranged.

7. The color filter array according to claim 1, wherein each of the color filters has a circular shape.

8. The color filter array according to claim 1, wherein the color filters are arranged in the hexagonal lattice, and each of the color filters has a hexagonal shape.

9. A solid-state image sensor comprising:

a color filter array;

a microlens array; and an image sensor irradiated with light through the color filter array and the microlens array, and a main lens that guides light from an object to the microlens array and the image sensor, wherein the color filter array includes a plurality of color filters of multiple colors, the color filters are arranged so that each color filter of each color corresponds to any one of a plurality of microlenses included in a microlens array, each microlens being configured to irradiate a plurality of pixels with light, the color filters are arranged in a hexagonal lattice, the color filters are arranged in a manner that at least two color filters of a same color from among the color filters arranged adjacent to one color filter are arranged non-point-symmetrically with respect to the one color filter, the main lens is arranged at a position such that an image plane is separate from the microlens array and on a side facing one of the object and the image sensor, and the microlens array is arranged such that an image through each of the plurality of microlenses is focused at each area of the color filters of multiple colors.

10. A color filter array comprising a plurality of color filters of multiple colors, wherein the color filters are arranged so that the color filter of each color corresponds to any one of a plurality of microlenses included in a microlens array, each microlens being configured to irradiate a plurality of pixels with light, wherein the color filters are arranged in a hexagonal lattice, and a set of one color filter of a first color, three color filters of a second color, and one color filter of a third color sequentially arranged adjacent to one another in a line is repeated along the line and the set is repeated adjacent to the line with a shifted amount of 1.5 filters.

11. The color filter array according to claim 10, wherein the color filters are arranged in a manner that at least two color filters of a same color from among the color filters arranged adjacent to one color filter are arranged non-point-symmetrically with respect to the one color filter.

12. The color filter array according to claim 10, wherein the color filters are arranged in a manner that at least one first filter of a same color is arranged in a vicinity of a second color filter of the same color.

13. The color filter array according to claim 10, wherein the color filters have an arrangement in which color filters of two or more colors are arranged adjacent to one another and in a line.

14. The color filter array according to claim 10, wherein the color filters include color filters of two or more colors.

15. The color filter array according to claim 10, wherein the color filters have a region where any color filters are not arranged.

16. The color filter array according to claim 10, wherein each of the color filters has a circular shape.

17. The color filter array according to claim 10, wherein the color filters are arranged in the hexagonal lattice, and each of the color filters has a hexagonal shape.

\* \* \* \* \*